(12) United States Patent
Chan (10) Patent No.: US 8,643,392 B2
(45) Date of Patent: Feb. 4, 2014

(54) PNEUMATICALLY ACTUATED IC SOCKET WITH INTEGRATED HEAT SINK

(75) Inventor: Glenn Chan, Fremont, CA (US)

(73) Assignee: Incavo Otax, Inc., Austin, TX (US)

( * ) Notice: Subject to any disclaimer, the term of this patent is extended or adjusted under 35 U.S.C. 154(b) by 444 days.

(21) Appl. No.: 13/078,830

(22) Filed: Apr. 1, 2011

(65) Prior Publication Data

US 2012/0252243 A1 Oct. 4, 2012

(51) Int. Cl.
*G01R 31/00* (2006.01)
*G01R 31/10* (2006.01)

(52) U.S. Cl.
USPC ............. 324/750.01; 324/750.09; 324/756.02

(58) Field of Classification Search
None
See application file for complete search history.

(56) References Cited

U.S. PATENT DOCUMENTS

| | | | | |
|---|---|---|---|---|
| 4,962,356 | A | * | 10/1990 | Eberlein et al. ........... 324/754.08 |
| 6,377,474 | B1 | * | 4/2002 | Archambeault et al. ...... 361/818 |
| 7,180,743 | B2 | * | 2/2007 | Chen et al. .................... 361/704 |
| 7,218,129 | B2 | | 5/2007 | Beaman et al. |
| 7,548,422 | B2 | * | 6/2009 | Hsieh ............................ 361/695 |
| 7,589,545 | B2 | | 9/2009 | Heinke et al. |
| 8,297,342 | B2 | * | 10/2012 | Schultz ........................ 165/80.4 |
| 8,471,575 | B2 | * | 6/2013 | Fregeau et al. .......... 324/750.03 |
| 2004/0139756 | A1 | | 7/2004 | Wall et al. |
| 2010/0019791 | A1 | | 1/2010 | Yamashita |

* cited by examiner

*Primary Examiner* — Vinh Nguyen
(74) *Attorney, Agent, or Firm* — Victor H. Okumoto (57) ABSTRACT

An IC socket is pneumatically actuated and has an integrated heat sink. Thermally conductive elements of the heat sink extend through an opening of a pneumatically actuated element shaped as a closed curve of finite width so that heat radiating from the thermally conductive elements may dissipate through a top opening of the IC socket. Downward force exerted by the pneumatically actuated element is transferred through a gimbaled multi-plate and spring arrangement to provide even pressure on the die and substrate of an IC device being held in place by the IC socket. A spring-loaded ground tab on the bottom of the IC socket simplifies grounding of the IC socket to avoid damaging the held IC device by static discharge.

19 Claims, 11 Drawing Sheets fig.1 fig.2 fig.3 fig.4 fig.5 fig.6 fig.7 fig.8 fig.9 fig.10 fig.11 fig.12 fig.13 fig.14 fig.15 fig.16 fig.17 fig.18

PNEUMATICALLY ACTUATED IC SOCKET WITH INTEGRATED HEAT SINK

FIELD OF THE INVENTION

The present invention generally relates to the testing of integrated circuits and in particular, to a pneumatically actuated integrated circuit socket with integrated heat sink.

BACKGROUND

An integrated circuit (IC) socket mechanically and electrically connects an IC device to a printed circuit board. As an example, the IC socket may mechanically secure and electrically connect the IC device to a test board for testing the IC device. The testing may be rudimentary such as for simple open-short testing or it may be more extensive to cover functionality and timing specifications. In the latter case, the IC device may heat up while it is operating at full speed. In this case it may be necessary to cool or otherwise control the temperature of the IC device to prevent damaging it.

When the IC device is being temporarily installed on a test board, it is advantageous to use an IC socket in which the IC device may be easily connected to and disconnected from the test board. In this case, it is also advantageous to use a connecting mechanism that is quick, reliable, repeatable, easily adjustable, user friendly, and safe, such as pneumatic actuation.

U.S. 2010/001979 A1 discloses an electronic component pressing device that employs four pneumatic cylinders to cause a first pressing member to press against a die of an IC device through a gimbal mechanism to make sure the pressure is applied evenly over the surface of the die and a thermal head which serves as both a heating and cooling source to maintain temperature control on the first pressing member. In a separate action, four pipes for suction and pressure, which pass through the gimbal mechanism and thermal head, cause a second pressing member to press against a substrate of the IC device.

Such a pressing device with multiple actuators and elaborate temperature control, however, is not easily adaptable to an IC socket. Further, in applications where a simple heat sink is useful for cooling an IC device during its operation, the construction of such a pressing device may not readily accommodate proper air cooling of the heat sink.

OBJECTS AND SUMMARY

Accordingly, one object of one or more aspects of the present invention is an IC socket with an integrated heat sink for testing IC devices.

Another object of one or more aspects of the present invention is an IC socket using pneumatic actuation.

Another object of one or more aspects of the present invention is an IC socket that does not damage an IC device by applying excessive force on its die or substrate.

Another object of one or more aspects of the present invention is an IC socket that evenly applies holding pressures against a die and substrate of an IC device when holding the IC device in place.

Still another object of one or more aspects of the present invention is an IC socket that is easily grounded to a printed circuit board to avoid damaging an inserted IC device by static discharge.

Yet another object of one or more aspects of the present invention is an IC socket that facilitates fast, reliable, repeatable, adjustable, user friendly, and/or safe testing of IC devices.

These and additional objects are accomplished by the various aspects of the present invention, wherein briefly stated, one aspect is an integrated circuit socket comprising: a pneumatically actuated force element shaped as a closed curve of finite width so as to define an opening within the closed curve; and a heat sink having a thermally conductive plate and at least one thermally conductive element disposed on a top surface of the plate, wherein the thermally conductive element extends through the opening of the pneumatically actuated force element and at least a portion of a bottom surface of the heat sink plate thermally contacts an integrated circuit die when the pneumatically actuated force element is pneumatically actuated.

Another aspect is an integrated circuit socket comprising: a force block; an actuation plate; an intermediate plate having at least one spring on the intermediate plate top surface and a block on the intermediate plate bottom surface; and a load block having an opening. The actuation plate is disposed relative to the intermediate plate so that the at least one spring may be compressed by the actuation plate bottom surface. The intermediate plate is disposed relative to the load block so that the intermediate plate block is disposed within the load block opening. An integrated circuit die is disposed on a substrate. The bottom surface of the load block applies pressure on the substrate while the intermediate plate block applies pressure on the integrated circuit die when the integrated circuit die is disposed beneath the intermediate plate block and the force block applies a force against the actuation plate top surface which force is fully transferred to the load block bottom surface through direct contact with the load block and partially transferred to the intermediate plate block through compression of the at least one spring.

Still another aspect is an integrated circuit socket comprising: a socket base having a cavity area in which an integrated circuit device to be tested may be inserted so as to make electrical contact with a printed circuit board when the socket base is installed on the printed circuit board; and a spring loaded ground tab attached to a bottom surface of the socket base for grounding the integrated circuit socket to the printed circuit board when the socket base is installed on the printed circuit board.

Additional objects, features and advantages of the various aspects of the present invention will become apparent from the following description, which description should be taken in conjunction with the accompanying drawings.

DETAILED DESCRIPTION

In the following description, spatially relative terms—such as "beneath", "below", "lower", "above", "upper", "proximal", "distal", and the like—may be used to describe one element's or feature's relationship to another element or feature as illustrated in the figures. These spatially relative terms are intended to encompass different positions (i.e., locations) and orientations (i.e., rotational placements) of a device in use or operation in addition to the position and orientation shown in the figures. For example, if a device in the figures is turned over, elements described as "below" or "beneath" other elements or features would then be "above" or "over" the other elements or features. Thus, the exemplary term "below" can encompass both positions and orientations of above and below. A device may be otherwise oriented (rotated 90 degrees or at other orientations) and the spatially relative descriptors used herein interpreted accordingly.

Figure 1:
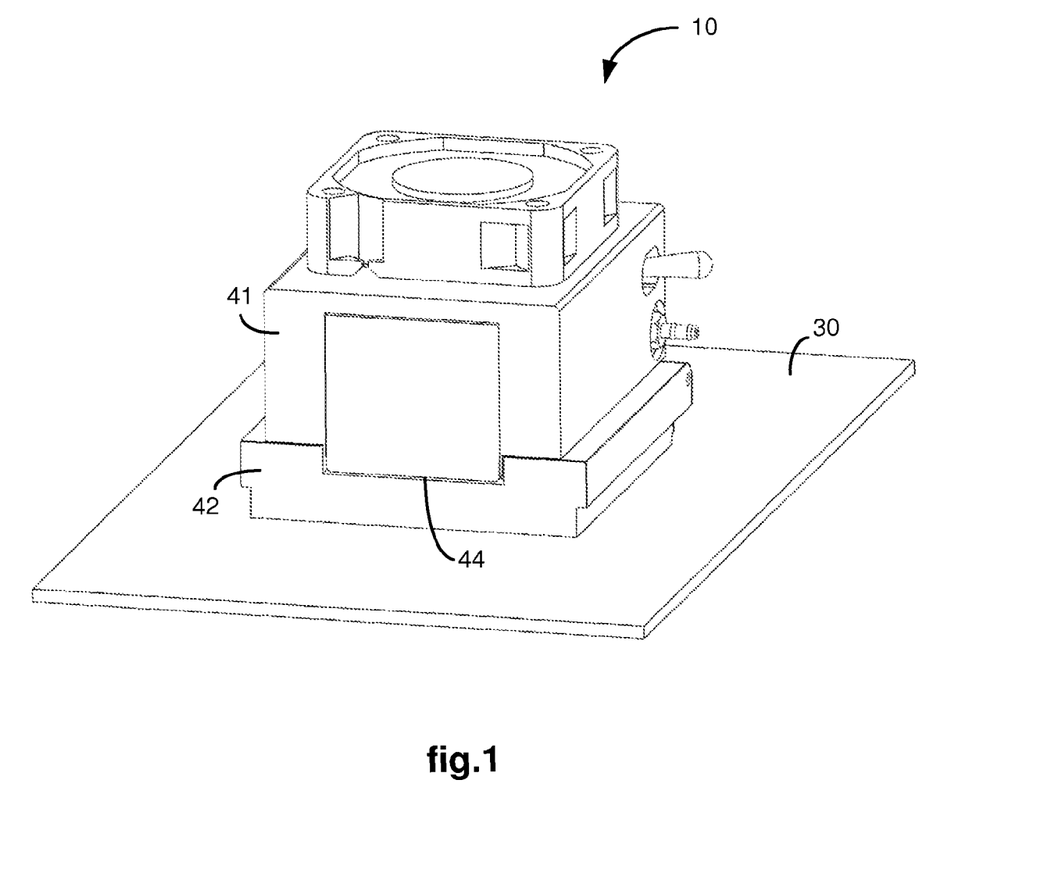
FIG. 1 illustrates a perspective view of an integrated circuit socket in a closed position.
Figure 7:
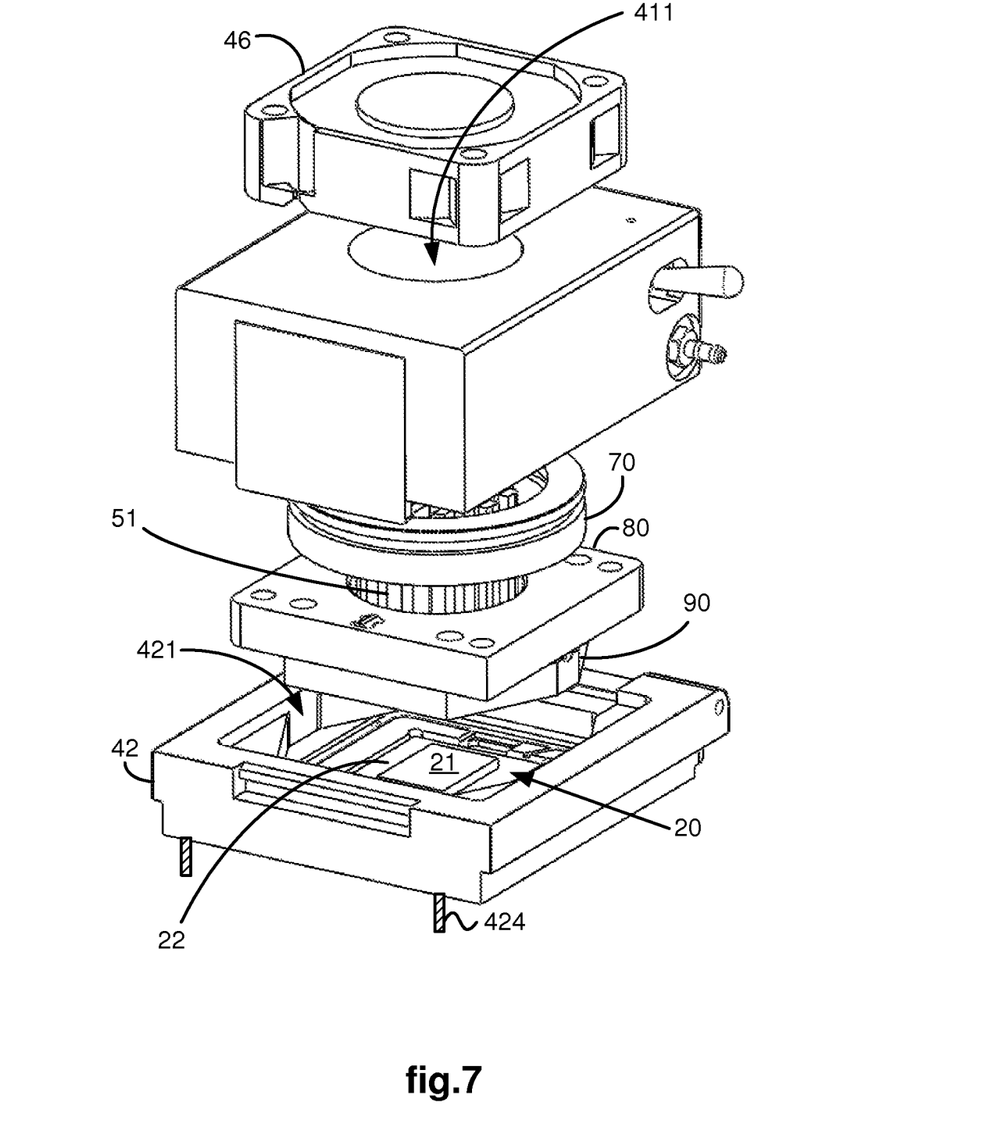
FIG. 7 illustrates an exploded view of parts of a main assembly of an integrated circuit socket.

FIG. 1 illustrates a perspective view of an integrated circuit (IC) socket 10 in a closed position. The IC socket 10 includes an upper housing unit 41 which is pivotally coupled to a socket base 42 by a hinge 43. A latch 44 may be operated by an operator to secure the upper housing unit 41 to the socket base 42 in the closed position as shown. The IC socket 10 is installed on a printed circuit board 30 by screws 424 (as seen in the exploded perspective view of FIG. 7) or other functionally similar means so an integrated circuit assembly 20 being held in place by the IC socket 10 may be electrically connected to the printed circuit board 30.

Figure 2:
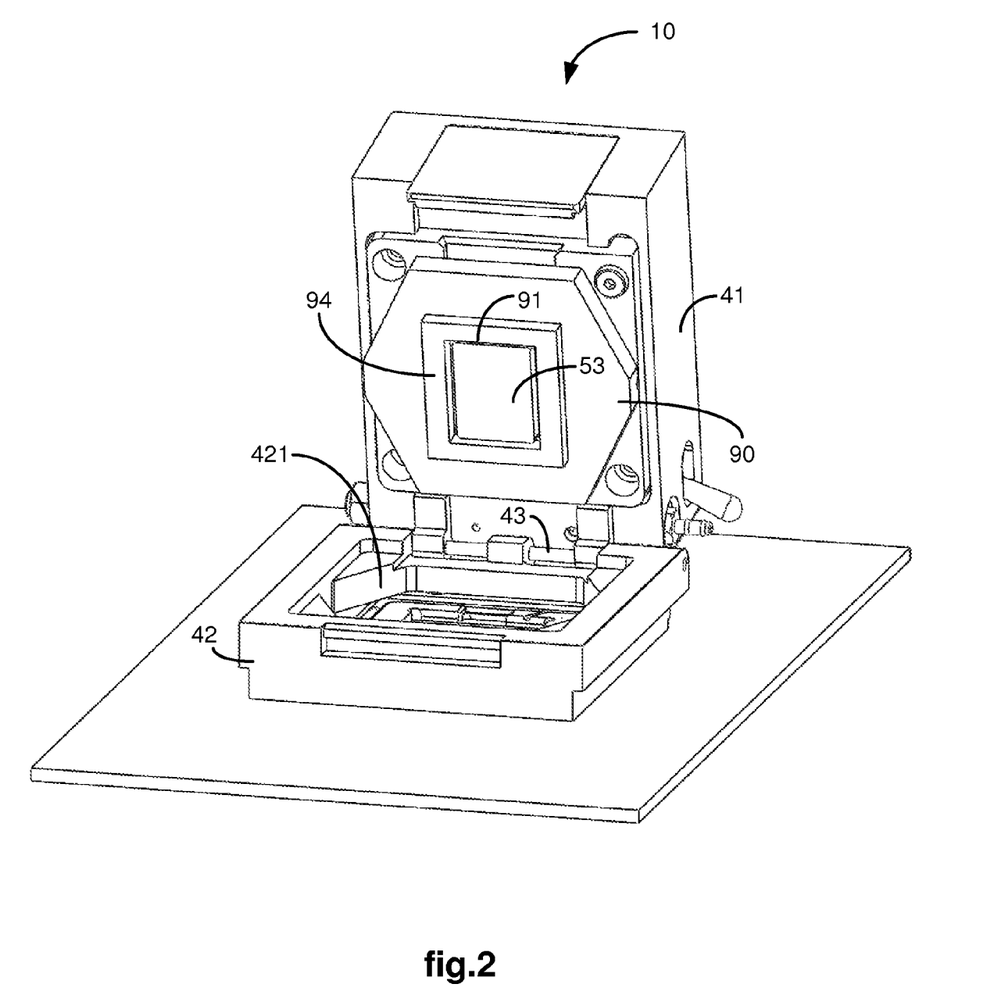
FIG. 2 illustrates a perspective view of an integrated circuit socket in an open position.

FIG. 2 illustrates a perspective view of the IC socket 10 in an open position. In the open position, the interior of the socket base 42 is seen to include a cavity area 421 in which the IC device 20 (comprising a die 21 and substrate 22) may be inserted and held in place (as better viewed from the perspective of FIG. 7). A bottom view of the upper housing unit 41 is also seen with the IC socket 10 held in the open position. In particular, a bottom view of a load block 90 is seen. The load block 90 has a lower surface area 94 and an opening 91 through which a heat sink block 53 extends. When the IC socket 10 is pneumatically actuated, the heat sink block 53 makes physical and thermal contact with the IC die 21 of the IC device 20 and the load block lower surface area 94 makes physical contact with the substrate 22 of the IC device 20 to hold the IC device 20 in place and make electrical connections with the printed circuit board 30 for testing or other purposes.

Figure 3:
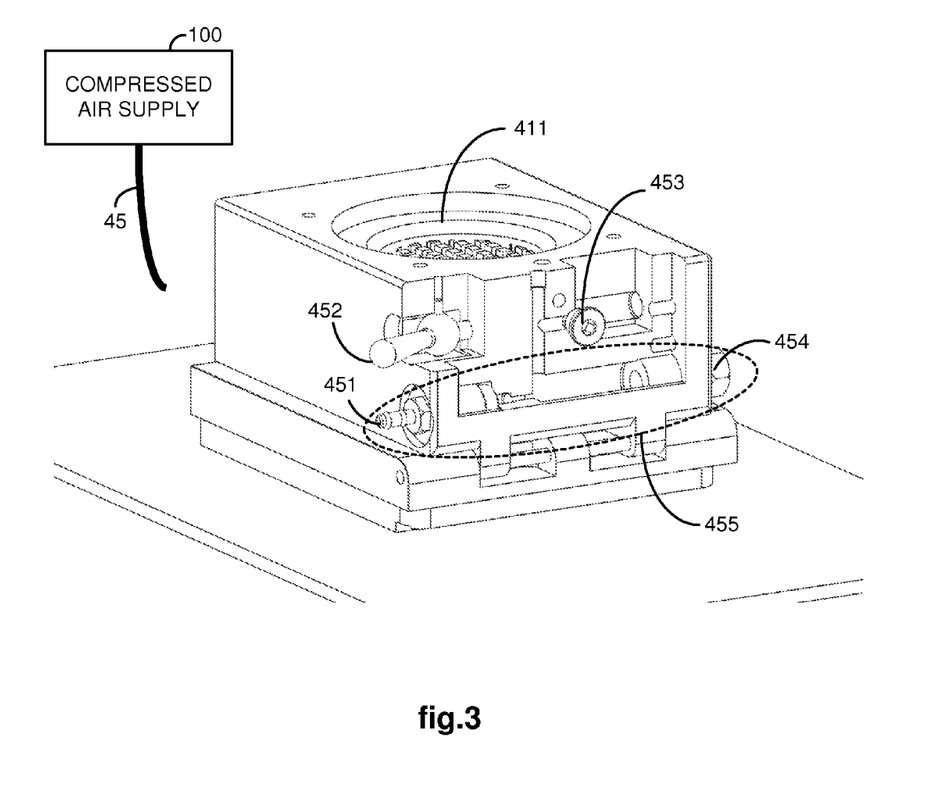
FIG. 3 illustrates a perspective, cut-away view of an integrated circuit socket detailing pneumatic control components.

FIG. 3 illustrates a perspective, cut-away view of the IC socket 10 to show pneumatic control components that have been integrated into the IC socket 10. A pneumatic line connector 451 is connectable to a pneumatic line 45 which provides a source of compressed air from a compressed air supply 100 to pneumatically actuated components of the IC socket 10. A pressure switch 452 allows compressed air being provided by the pneumatic line 45 to enter the IC socket 10 when in a first switch position and allows compressed air already in the IC socket 10 to be released through a relief valve as part of the switch 452 when in a second switch position. A pressure gauge port 453 allows a pressure gauge to be connected to the IC socket 10 to measure the pneumatic pressure currently being provided to a piston chamber 60 of the IC socket 10. A pressure adjuster 454 allows an operator to adjust the pneumatic pressure of the compressed air being provided to the piston chamber 60 to be regulated in the IC socket 10. The pressure switch 452 and pressure adjuster 454 thus combine to function as a pressure regulator 455 that maintains the pneumatic pressure being provided to the piston chamber 60 in the IC socket 10 at a desired value by pressure switch 452 releasing just enough compressed air provided through the pneumatic line 45 to maintain the pressure in the IC socket 10 at the pressure set by the operator by adjusting the setting of the pressure adjuster 454.

Figure 4:
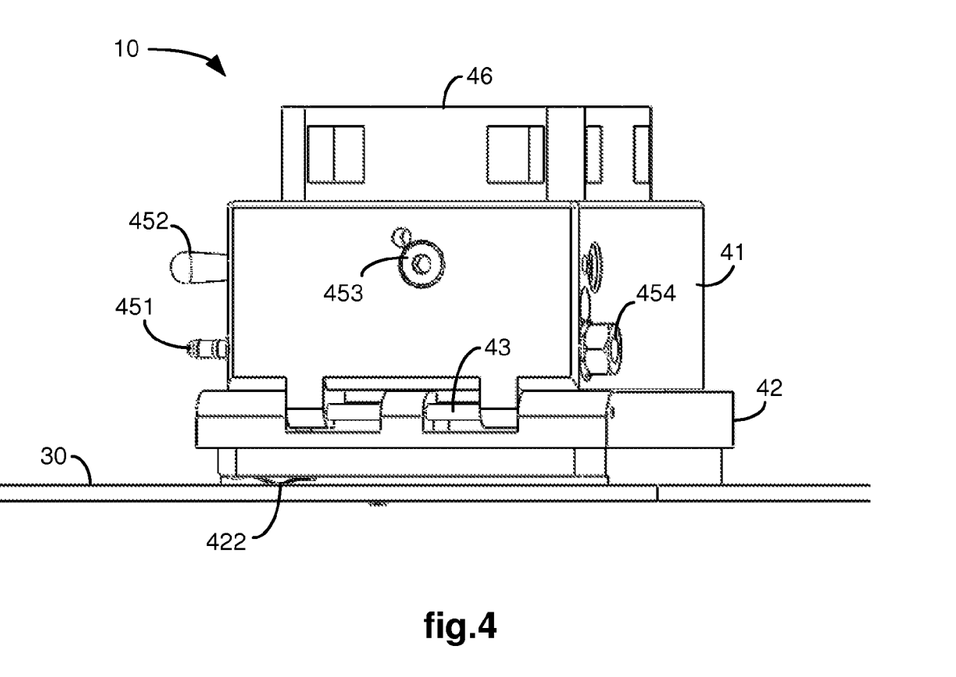
FIG. 4 illustrates a side view of an integrated circuit socket.

FIG. 4 illustrates a side view of the IC socket 10 in which external parts of the pneumatic line connector 451, pressure switch 452, pressure gauge port 453, and pressure adjuster 454 are shown. Also shown are the upper housing unit 41, the socket base 42, and the hinge 43 which is used for opening and closing the IC socket 10 by respectively rotating up and down the upper housing unit 41 away from and towards the socket base 42. Also shown is the printed circuit board 30, upon which, the IC socket 10 is mechanically and electrically connected to, and a spring loaded ground tab 422 which serves to ground the IC socket 10 to the printed circuit board 30 to prevent static discharge damage to the IC die 21 being held at the time by the IC socket 10.

Figure 5:
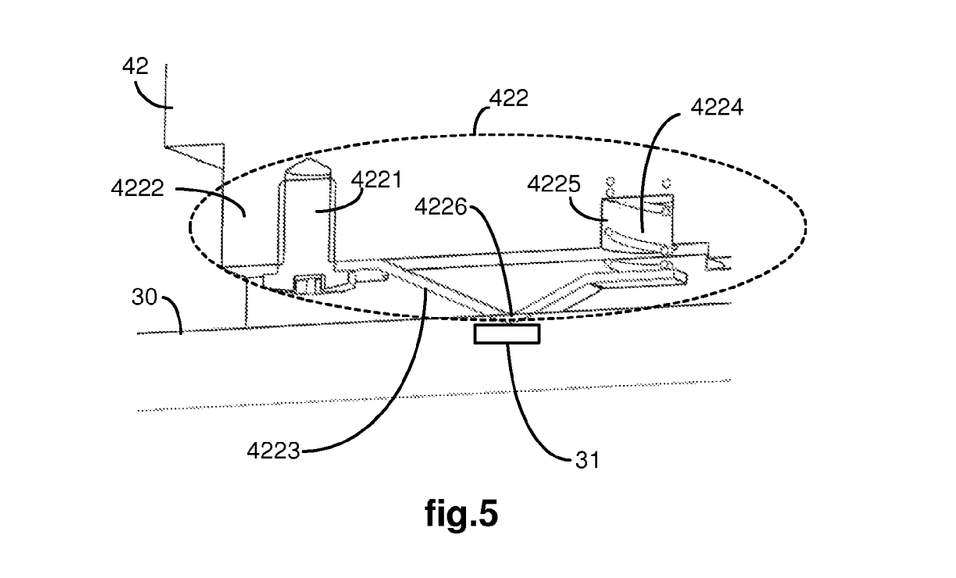
FIG. 5 illustrates a partial view of a socket base of an integrated circuit socket detailing a spring-loaded ground tab.

FIG. 5 illustrates a partial and enlarged view of the socket base 42 of the IC socket 10, which provides further details on the spring-loaded ground tab 422. A conductive plug (or screw) 4221 is plugged (or screwed) into the bottom of the socket base 42 in an offset 4222 which is elevated above the top surface of the printed circuit board 30. A v-shaped tab 4223 is coupled at one end to the plug 4221 and makes contact at the other end with a spring 4224 that is embedded in a cavity 4225 of the socket base 42. The spring 4224 provides a bias force on the base 4226 of the v-shaped tab 4223 so that when the socket base 42 is set on the printed circuit board 30, the base 4226 presses against a ground contact 31 on the printed circuit board 30. The spring-loaded ground tab 422 thus provides a simple means of immediately grounding the IC socket 10 to the printed circuit board 30 as the IC socket 10 is being affixed to the printed circuit board 30. In contrast, prior art means for such grounding may involve connecting a ground strap to both the IC socket 10 and the printed circuit board 30 (or other grounding point).

Details on the internal construction and operation of the IC socket 10 is now described in reference to FIGS. 6-12. The IC socket 10 is pneumatically actuated and has an integrated heat sink 50. To accommodate the heat sink 50, a ring-shaped piston 70 and a piston chamber 60 adapted to accommodate the ring-shaped piston 70 are used so that cooling fins 51 of the heat sink 50 may extend through openings 71 and 411 respectively of the ring-shaped piston 70 (as better seen in the exploded perspective view of FIG. 8) and piston chamber 60. This allows the cooling fins 51 to be air-cooled through a top opening of the upper housing unit 41, which in this case is the same as the opening 411 of the piston chamber 60. To ensure that proper and non-excessive pressure is applied evenly on an IC device being held at the time by the IC socket 10, a multi-plate gimbal and spring architecture is employed in the IC socket 10.

Figure 6:
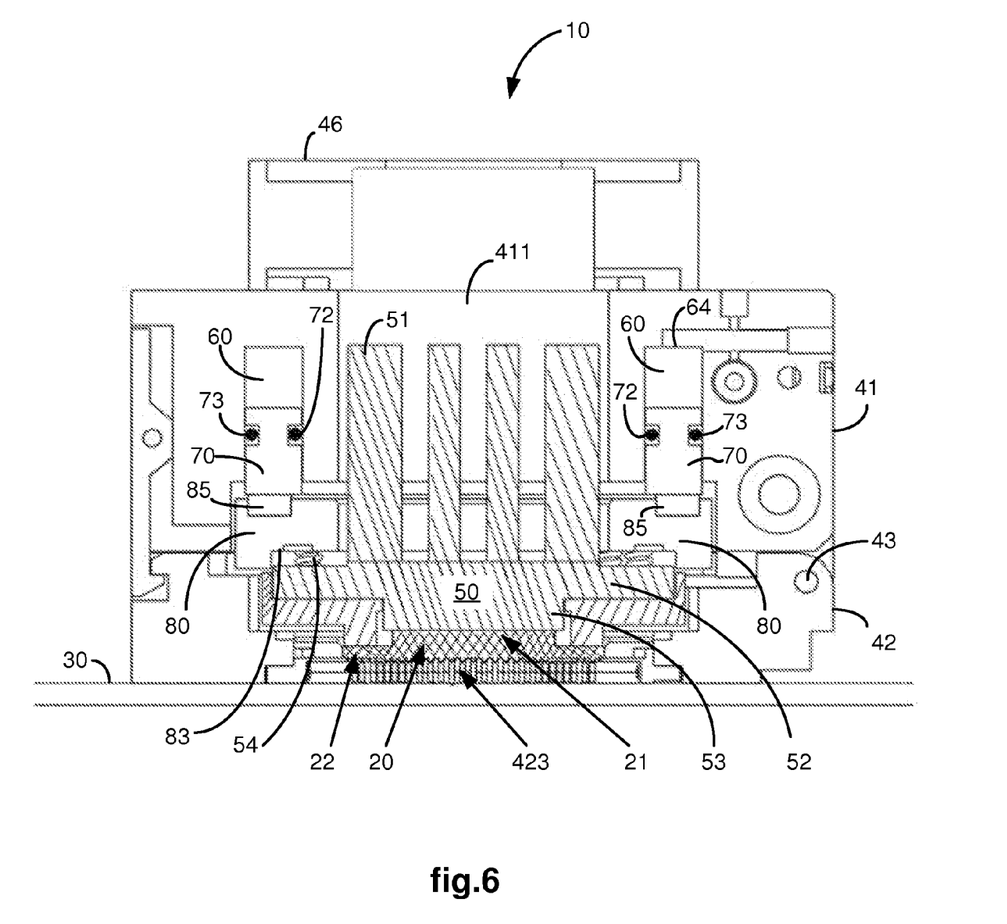
FIG. 6 illustrates a cross-sectional view of an integrated circuit socket.

FIG. 6 illustrates a cross-sectional view of the IC socket 10, an IC device 20 being held by the IC socket 10, and a printed circuit board 30 upon which the IC socket 10 has been installed. As described in reference to FIGS. 1 and 2, the IC socket 10 is principally constructed of an upper housing unit 41 and a socket base 42. The IC device 20 is inserted in a cavity 421 of the socket base 42 (as better seen in FIG. 7) and held in position by pneumatically actuated components of the upper housing unit 41. The IC device 20 includes an integrated circuit (IC) 21 and a substrate 22 upon which the IC die 21 resides. Signal, power, and ground contacts of the IC die 21 are electrically connected to corresponding pins 423 on a bottom surface of the socket base 42. The pins 423 are then electrically connected to corresponding contacts on the printed circuit board 30 so that the IC die 21 may be electrically stimulated. A heat sink 50 that is built into the upper housing unit 41 makes contact with the IC die 21 to dissipate heat away from the IC die 21 through the top opening 411 in the upper housing unit 41. A fan 46 is provided above the opening to further assist in dissipating the heat.

The pneumatic actuation mechanism used in the IC socket 10 includes a pneumatic piston 70 that is ring-shaped (aspects of which may be better seen in perspective views of FIGS. 7 and 8) and a piston chamber 60 that is shaped to accommodate the ring-shaped piston 70 so that it may freely slide up and down in the chamber 60. The piston chamber 60 is configured in this case so as to resemble the volume between two nested cylinders wherein the inner cylinder has an outer diameter slightly less than an inner diameter of the ring-shaped piston 70 (i.e., the diameter of its hole) and the outer cylinder has an inner diameter slight more than an outer diameter of the ring-shaped piston 70. An inner O-ring 72 is provided in a slot around the inner diameter of the ring-shaped piston 70 and an outer O-ring 73 is provided in an opposing slot around the outer diameter of the ring-shaped piston 70. The volume of the chamber 60 that is above the piston 70 is sealed airtight except for a pneumatic line opening 64 which is provided so that compressed air may be injected into and released from the piston chamber 60. The O-rings 72, 73 are lubricated so that the piston 70 may move up and down along the walls of the chamber 60 while maintaining the chamber 60 to be generally airtight when the pneumatic line to the opening 64 is shut off by the pressure switch 452. The providing, regulating, and releasing of compressed air to the piston chamber 60 by pneumatic control components was previously described in reference to FIG. 3.

Also shown in FIG. 6 is a cross-sectional view of the thermally conductive heat sink 50 (aspects of which may be better seen in perspective views of FIGS. 7-12). The heat sink 50 includes a thermally conductive plate 52 which has a plurality of thermally conductive cooling fins 51 disposed on a top surface of the plate 52. The heat sink 50 also includes a thermally conductive contact block 53 disposed on a bottom surface of the plate 52. Although described as separate components, the plate 52, cooling fins 51, and block 53 may be molded or otherwise manufactured as a single unit. The heat sink 50 also has a plurality of springs 54 disposed around the plurality of cooling fins 51 on the top surface of the plate 52. The contact block 53 contacts the top surface of the IC die 21 so that as the IC die 21 heats up while being electrically stimulated by the printed circuit board 30, the heat sink 50 provides a thermally conductive path for the heat to dissipate from the IC die 21. The cooling fins 51 are designed to provide surface area for the heat to be dissipated through air cooling. An air channel from the cooling fins 51 to the top opening of the upper housing unit 41 is provided through the aligned "donut holes" of the ring-shaped piston 70 and piston chamber 60. To provide additional air cooling, the fan 46 is provided above the opening.

Figure 8:
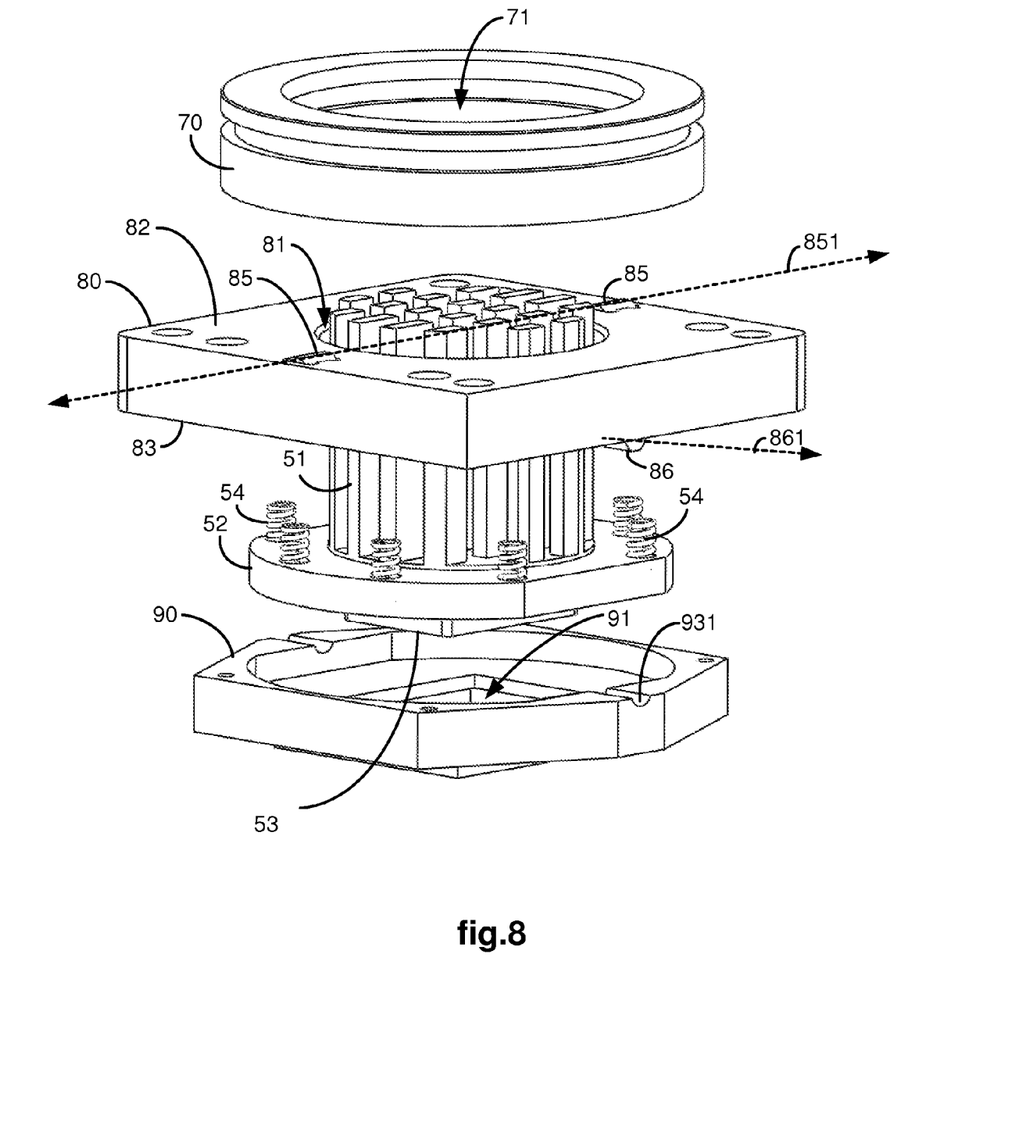
FIG. 8 illustrates an exploded view of parts of an actuation assembly of an integrated circuit socket.
Figure 9:
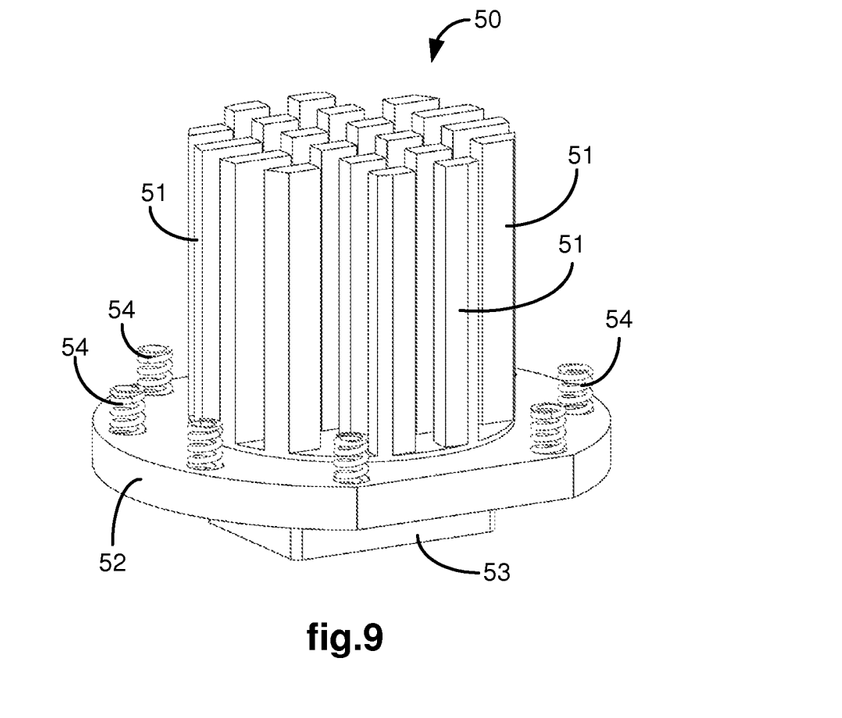
FIG. 9 illustrates a top perspective view of a heat sink of an integrated circuit socket.
Figure 10:
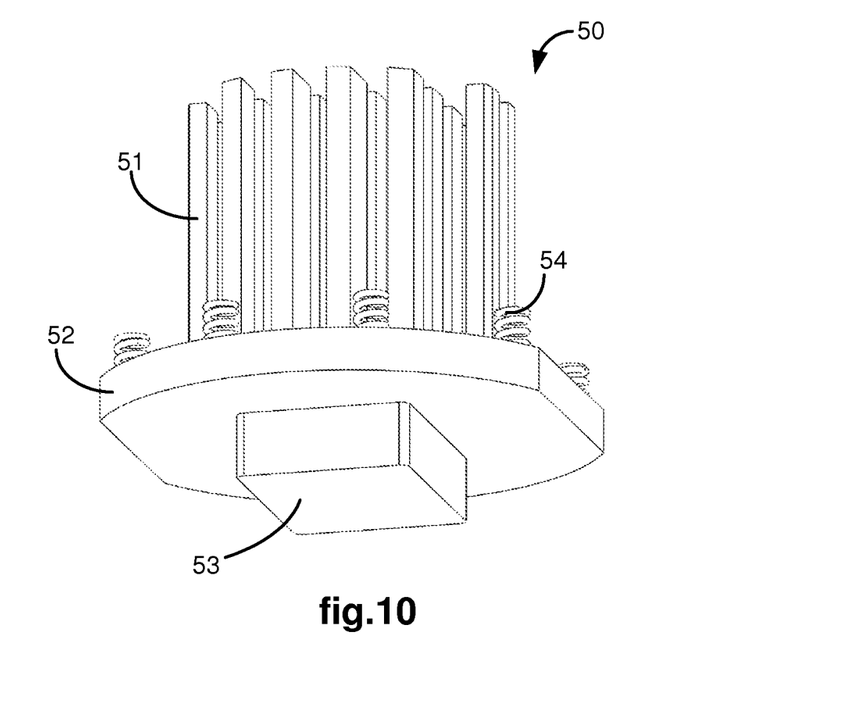
FIG. 10 illustrates a bottom perspective view of a heat sink of an integrated circuit socket.
Figure 11:
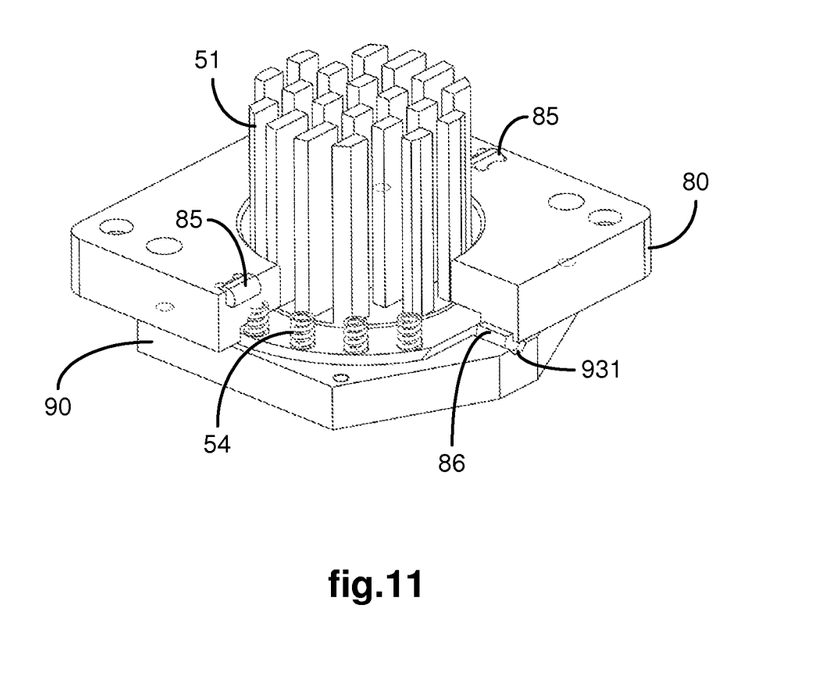
FIG. 11 illustrates a top perspective view of an actuation plate, heat sink, and load board assembly in an integrated circuit socket.
Figure 12:
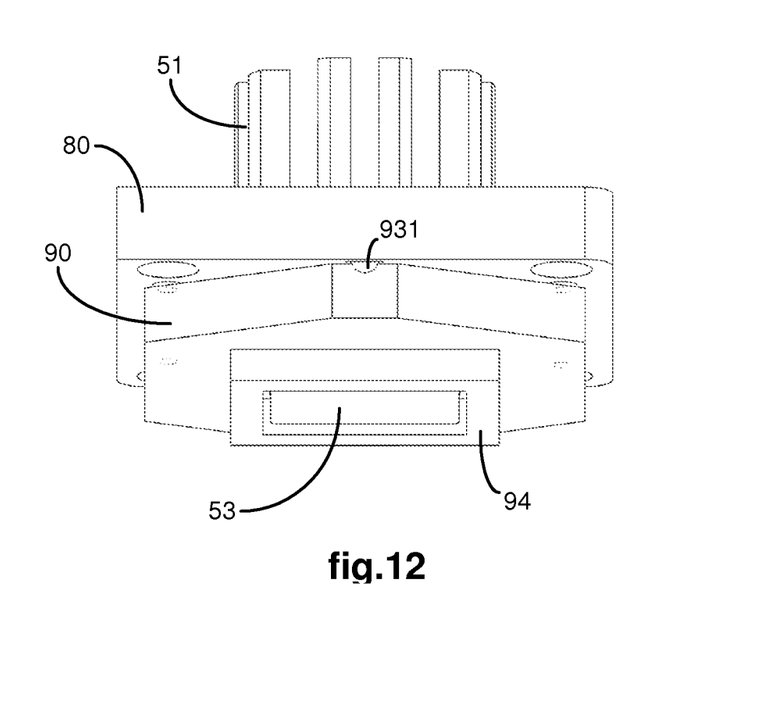
FIG. 12 illustrates a bottom perspective view of an actuation plate, heat sink, and load board assembly in an integrated circuit socket.

When compressed air is injected into the piston chamber 60 by an operator turning on the pressure switch 452, the compressed air forces the pneumatic piston 70 to slide down the piston chamber 60 so as to contact and exert a force on a pair of convex protrusions 85 on opposing sides of a top surface 82 of an actuation plate 80 (as better seen in the perspective view of FIG. 8). The pair of convex protrusions 85 serves as gimbaling elements so that the actuation plate 80 may gimbal about a first horizontal axis 851 (i.e., a line extending between the pair of convex protrusions 85) when the pneumatic piston 60 applies a contact force on at least one of the pair of convex protrusions 85. A second pair of convex protrusions 86 is formed on a bottom surface 83 of the actuation plate 80. This second pair of convex protrusions 86 is offset ninety degrees from the first pair of convex protrusions 85 and is adapted to mate with a pair of concave indentations 931 formed in a top surface of a load block 90 (as better seen in the perspective view of FIG. 8). The mated pairs of convex protrusions and concave indentations, 86 and 931, also serve as gimbaling elements so that the actuation plate 80 may gimbal about a second horizontal axis 861 (i.e., a line extending between the pair of convex protrusions 86, which line is orthogonal to the first horizontal axis) when the pneumatic piston 60 applies a contact force on at least one of the pair of convex protrusions 85. Thus, in this way, the force applied to the actuation plate 80 by the pneumatic piston 70 is transferred to the load block 90. The load block 90 has a lower surface area 94 (as better seen in the perspective view of FIG. 12) which in turn, contacts and applies an even pressure against the substrate 22 of the IC device 20 when the pneumatic piston 70 applies the force on the actuation plate 80. Thus, the gimbaling elements 85 and 86 ensure that the pressure is applied evenly on the substrate 22.

The heat sink 50 is disposed between the actuation plate 80 and the load block 90 so that the heat sink cooling fins 51 pass through an actuation plate opening 81 and the heat sink contact block 53 passes through a load block opening 91 (as can be seen in the exploded perspective view of FIG. 8). Thus, when the actuation plate 80 is driven to contact the load block 90 by actuation of the pneumatic piston 70 by compressed air injected into the piston chamber 60, the heat sink springs 54 are compressed against a lower surface area 83 of the actuation plate 80. The compression of the heat sink springs 54 results in a downward force being exerted on the heat sink plate 52 and the contact block 53 on the lower surface of the heat sink plate 52. The contact block 53 then applies an even pressure against the top of the IC die 21 which is disposed in the cavity 421 of the socket base 42 directly below the block 53 at the time.

Figure 13:
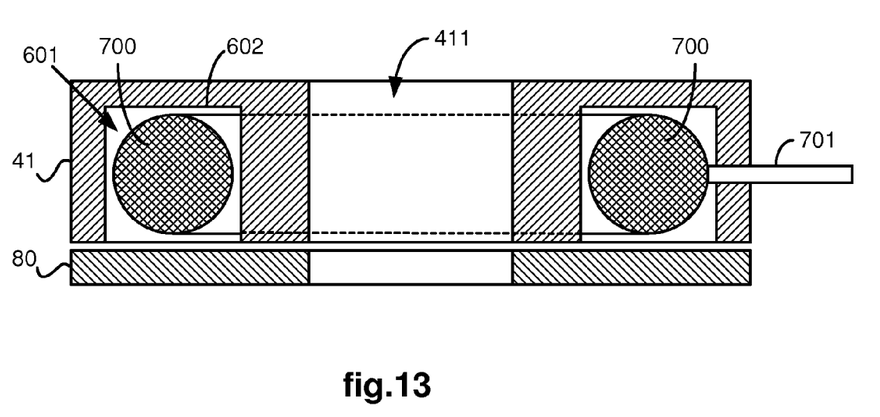
FIG. 13 illustrates a cross-sectional view of a pneumatically actuated inner tube, in a non-actuated state, which is usable in an alternative pneumatic actuation mechanism in the IC socket of FIGS. 1-12.
Figure 14:
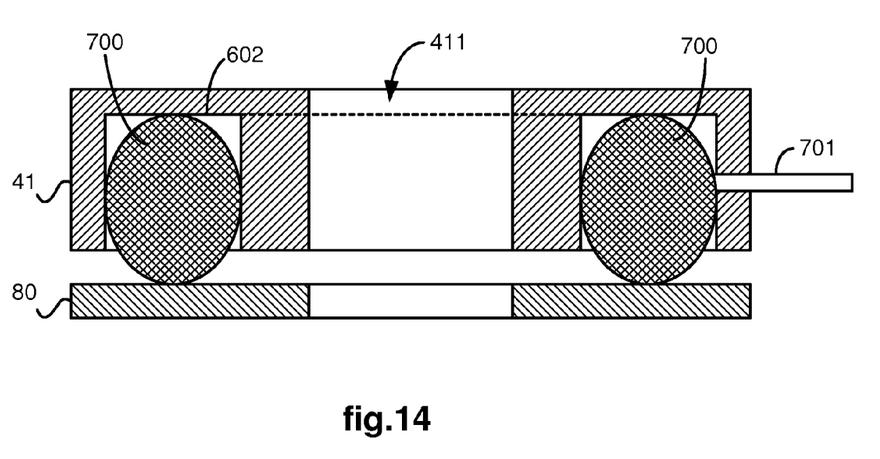
FIG. 14 illustrates a cross-sectional view of a pneumatically actuated inner tube, in an actuated state, which is usable in an alternative pneumatic actuation mechanism in the IC socket of FIGS. 1-12.

FIGS. 13 and 14 illustrate cross-sectional views of a pneumatic actuation mechanism that may be used as an alternative to the pneumatic mechanism previously described as including the ring-shaped piston 70 and piston chamber 60 in the IC socket 10. The mechanism in this alternative embodiment includes a pneumatically actuated inner tube 700 disposed in a chamber 601 of the upper housing unit 41. As shown in FIG. 13, when the pneumatically actuated inner tube 700 is in a non-actuated (e.g., non-inflated) state, space may be available between the inner tube 700 and the walls 602 of the chamber 601. In the non-actuated state, the pneumatically actuated inner tube 700 exerts no force on the pair of convex protrusions 85 on opposing sides of the actuation plate 80. As shown in FIG. 14, however, when the pneumatically actuated inner tube 700 is in an actuated (e.g., inflated) state, the inner tube 700 expands as air is supplied to it through line 701, which is coupled to the compressed air supply 100 through pneumatic line connector 451 and air line 45. Pneumatic control components 452-455 regulate the pressure supplied to the inner tube 700 in a similar manner as previously described in reference to regulation of the pressure in the piston chamber 60. In the actuated state, the pneumatically actuated inner tube 700 exerts a force on the pair of convex protrusions 85 on opposing sides of the actuation plate 80, which in turn, exerts forces directly and indirectly through the load block 90, springs 54, and heat sink 50 to the substrate 22 and die 21 of the IC device 20, as previously described. In this actuated state, the walls 602 of the chamber 601 prevent the pneumatically actuated inner tube 700 from further expanding in their directions so that the only direction left for expansion is through the opening of the chamber 601 and against the actuation plate 80 as shown in FIG. 14.

Figure 15:
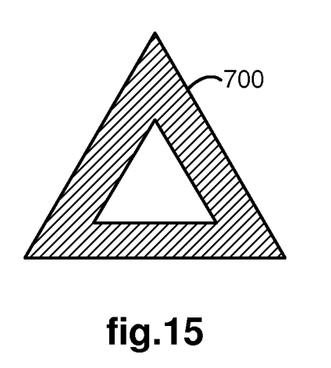
FIGS. 15-18 illustrate top views of alternative embodiments of pneumatically actuated inner tubes.
Figure 16:
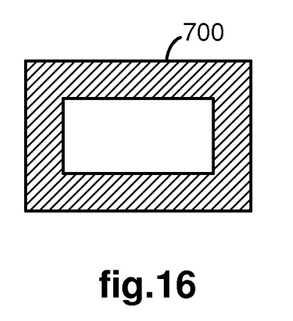
Figure 17:
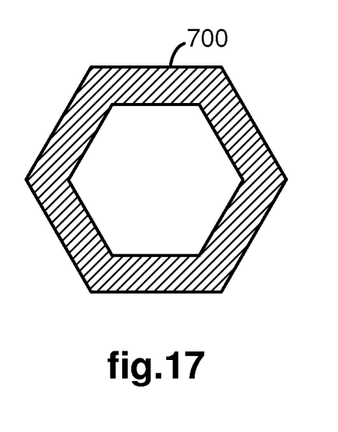
Figure 18:
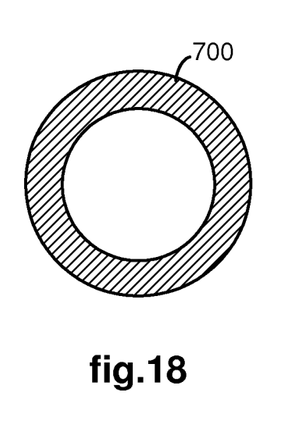

FIGS. 15-18 illustrate top views of alternative embodiments for the pneumatically actuated inner tube 700. As shown in FIGS. 15-17, the inner tube 700 may be shaped as a polygon in its deflated state. Alternatively, as shown in FIG. 18, the inner tube 700 may be shaped as a circle in its deflated state. As may be readily appreciated, the inner tube 700 may be shaped in any closed curve of finite thickness so as to define an opening in the closed curve and is not to be limited by the examples shown herein. Likewise, the ring-shaped piston 70 may also be shaped in any closed curve of finite thickness so as to define an opening in the closed curve. It too is not be limited by examples shown herein. Whatever the shape of the piston 70, the piston chamber 60 is to be adapted to the piston's shape so that the piston 70 may move within it according to the pneumatic principles described herein.

Although the various aspects of the present invention have been described with respect to an embodiment, it will be understood that the invention is entitled to full protection within the full scope of the appended claims.

What is claimed is:

1. An integrated circuit socket comprising:
    a pneumatically actuated force element shaped as a closed curve of finite width so as to define an opening within the closed curve; and
    a heat sink having a thermally conductive plate and at least one thermally conductive element disposed on a top surface of the plate, wherein the thermally conductive element extends through the opening of the pneumatically actuated force element and at least a portion of a bottom surface of the heat sink plate thermally contacts an integrated circuit die when the pneumatically actuated force element is pneumatically actuated.

2. The integrated circuit socket of claim 1, further comprising a piston chamber; wherein the pneumatically actuated force element includes a ring-shaped piston disposed in the piston chamber.

3. The integrated circuit socket of claim 2, wherein the heat sink has a block, at least one thermally conductive element wherein the at least one thermally conductive element is disposed within the opening of the ring-shaped piston and the block is disposed on the bottom surface of the plate so as to make contact with the integrated circuit die when the ring-shaped piston is pneumatically actuated so as to be driven towards the heat sink plate.

4. The integrated circuit socket of claim 2, wherein the piston chamber is shaped as a partially enclosed volume between a pair of nested cylinders so that an outer diameter of the inner cylinder is less than the inner diameter of the ring-shaped piston and an inner diameter of the outer cylinder is greater than an outer diameter of the ring-shaped piston so that the ring-shaped piston is slidable along an inner wall of the outer cylinder and an outer wall of the inner cylinder.

5. The integrated circuit socket of claim 4, wherein the at least one thermally conductive element extends through an open end of the inner cylinder so as to allow the at least one thermally conductive element of the heat sink to be air cooled when the heat sink block contacts the integrated circuit.

6. The integrated circuit socket of claim 5, further comprising:
    a fan disposed above the open end of the inner cylinder of the piston chamber to provide additional cooling for the at least one thermally conductive element of the heat sink.

7. The integrated circuit socket of claim 2, wherein the piston chamber and ring-shaped piston are enclosed in a housing unit, and the integrated circuit socket further comprises:
    a line coupled to a compressed air supply; and
    a switch integrated as part of the housing unit, wherein the switch allows compressed air into the piston chamber through the line when in a first position and allows the compressed air in the piston chamber to be released when in a second position.

8. The integrated circuit socket of claim 2, wherein the piston chamber and ring-shaped piston are enclosed in a housing unit, and the integrated circuit socket further comprises:
    a line coupled to a compressed air supply;
    a pressure gauge port integrated as part of the housing unit, wherein the pressure gauge port is adapted to be coupled to a pressure gauge to measure the pressure of compressed air flowing into the piston chamber from the line; and
    a pressure adjuster integrated as part of the housing unit, wherein the pressure adjuster is adapted to adjust the pressure of compressed air flowing into the piston chamber from the line.

9. The integrated circuit socket of claim 2, wherein the piston chamber and ring-shaped piston are enclosed in a housing unit, and the integrated circuit socket further comprises:
    a line coupled to a compressed air supply;
    a pressure regulator integrated as part of the housing unit, wherein the pressure regulator is adapted to regulate the pressure of compressed air flowing into the piston chamber from the line to a pre-set value.

10. The integrated circuit socket of claim 1, wherein the pneumatically actuated force element is a pneumatically actuated inner tube.

11. The integrated circuit socket of claim 1, wherein the closed curve is shaped as one of a polygon and a circle.

12. An integrated circuit socket comprising:
    a force block;
    an actuation plate;
    an intermediate plate having at least one spring on the intermediate plate top surface and a block on the intermediate plate bottom surface, wherein the actuation plate is disposed relative to the intermediate plate so that the at least one spring may be compressed by the actuation plate bottom surface; and
    a load block having an opening, wherein the intermediate plate is disposed relative to the load block so that the intermediate plate block is disposed within the load block opening;

wherein an integrated circuit die is disposed on a substrate and the bottom surface of the load block applies pressure on the substrate while the intermediate plate block applies pressure on the integrated circuit die when the integrated circuit die is disposed beneath the intermediate plate block and the force block applies a force against the actuation plate top surface which force is fully transferred to the load block bottom surface through direct contact with the load block and partially transferred to the intermediate plate block through compression of the at least one spring.

13. The integrated circuit socket of claim 12, further comprising:

gimbaling means for gimbaling the actuation plate about first and second orthogonal axes relative to the load block so that the load block evenly applies pressure on the substrate and the intermediate plate block evenly applies pressure to the integrated circuit die.

14. The integrated circuit socket of claim 13, wherein the gimbaling means comprises:

at least one top gimbaling element on the actuation plate top surface area so the actuation plate may gimbal about the first horizontal axis when the force block applies a contact force on the at least one top gimbaling element of the actuation plate; and at least one bottom gimbaling element on the actuation plate bottom area and at least one gimbaling element on the load block top area so the at least one bottom gimbaling element of the actuation plate cooperates with the at least one gimbaling element of the load block so that the actuation plate may gimbal about the second horizontal axis.

15. The integrated circuit socket of claim 14, wherein the at least one top gimbaling element comprises a pair of convex protrusions on opposing sides of the actuation plate top surface area.

16. The integrated circuit socket of claim 14, wherein the at least one bottom gimbaling element on the actuation plate ledge comprises a pair of convex protrusions on opposing sides of the actuation plate bottom area and the at least one gimbaling element on the load block top area comprises a pair of concave indentations on opposing sides of the load block top area.

17. The integrated circuit socket of claim 12, wherein the force block is a pneumatically actuated piston.

18. The integrated circuit socket of claim 12, wherein the intermediate plate is part of a heat sink for cooling the integrated circuit.

19. An integrated circuit socket comprising:

a socket base having a cavity area in which an integrated circuit device may be inserted so as to make electrical contact with a printed circuit board when the socket base is installed on the printed circuit board;

a spring loaded ground tab attached to a bottom surface of the socket base for grounding the integrated circuit socket to the printed circuit board when the socket base is installed on the printed circuit board;

a pneumatically actuated force element shaped as a closed curve of finite width so as to define an opening within the closed curve; and a heat sink having a thermally conductive plate and at least one thermally conductive element disposed on a top surface of the plate, wherein the thermally conductive element extends through the opening of the pneumatically actuated force element and at least a portion of a bottom surface of the heat sink plate thermally contacts the integrated circuit die when the pneumatically actuated force element is pneumatically actuated.

* * * * *